United States Patent
Muramoto et al.

(10) Patent No.: US 8,994,054 B2
(45) Date of Patent: Mar. 31, 2015

(54) NITRIDE LED WITH A SCHOTTKY ELECTRODE PENETRATING A TRANSPARENT ELECTRODE

(75) Inventors: Eiji Muramoto, Kanagawa-ken (JP); Shinya Nunoue, Chiba-ken (JP); Toshiyuki Oka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 517 days.

(21) Appl. No.: 13/195,926

(22) Filed: Aug. 2, 2011

(65) Prior Publication Data

US 2011/0284908 A1    Nov. 24, 2011

Related U.S. Application Data

(63) Continuation of application No. PCT/JP2009/005955, filed on Nov. 9, 2009.

(30) Foreign Application Priority Data

Feb. 20, 2009    (JP) .................................. 2009-038591

(51) Int. Cl.
*H01L 33/36* (2010.01)
*H01L 33/38* (2010.01)
(Continued)

(52) U.S. Cl.
CPC ................ *H01L 33/38* (2013.01); *H01L 33/40* (2013.01); *H01L 33/12* (2013.01);
(Continued)

(58) Field of Classification Search
CPC ......... H01L 33/40; H01L 33/38; H01L 33/32; H01L 33/12
USPC ................. 257/98, E33.068, E33.062; 438/22
See application file for complete search history.

(56) References Cited

U.S. PATENT DOCUMENTS 5,309,001 A    5/1994    Watanabe et al.
6,169,296 B1 *    1/2001    Kamiyama et al. ............. 257/94
(Continued)

FOREIGN PATENT DOCUMENTS

CN    1993837 A    7/2007
JP    06-005921 A    1/1994
(Continued)

OTHER PUBLICATIONS

Office Action issued on Mar. 8, 2013 in the counterpart Chinese Patent Application No. 200980157138.X (with English Translation).
(Continued)

*Primary Examiner* — Fernando Toledo
*Assistant Examiner* — Peter Bradford
(74) *Attorney, Agent, or Firm* — Oblon, Spivak, McClelland, Maier & Neustadt, L.L.P.

(57) ABSTRACT

According to one embodiment, a semiconductor light emitting device includes a stacked structural body, a first electrode, a second electrode, a third electrode, and a fourth electrode. The stacked structural body includes a first semiconductor layer, a second semiconductor layer, and a light emitting layer provided between the first semiconductor layer and the second semiconductor layer. The first electrode is electrically connected to the first semiconductor layer. The second electrode forms an ohmic contact with the second semiconductor layer. The second electrode is translucent to light emitted from the light emitting layer. The third electrode penetrates through the second electrode and is electrically connected to the second electrode to form Shottky contact with the second semiconductor layer. The third electrode is disposed between the fourth electrode and the second semiconductor layer. A shape of the fourth electrode as viewed along a stacking direction of the first semiconductor layer, the light emitting layer, and the second semiconductor layer is same as a shape of the third electrode as viewed along the stacking direction.

13 Claims, 10 Drawing Sheets

(51) Int. Cl.
  *H01L 33/40* (2010.01)
  *H01L 33/12* (2010.01)
  *H01L 33/32* (2010.01)
(52) U.S. Cl.
  CPC ....... *H01L 33/32* (2013.01); *H01L 2224/48091* (2013.01); *H01L 2224/49107* (2013.01); *H01L 2924/3025* (2013.01)
  USPC .............. 257/98; 257/E33.062; 257/E33.068; 438/22

(56) References Cited

U.S. PATENT DOCUMENTS

| | | | |
|---|---|---|---|
| 2003/0010994 A1* | 1/2003 | Chen et al. ...................... | 257/99 |
| 2004/0113170 A1 | 6/2004 | Murakami et al. | |
| 2005/0168899 A1* | 8/2005 | Sato et al. .................... | 361/91.1 |
| 2007/0284607 A1* | 12/2007 | Epler et al. .................... | 257/103 |
| 2008/0179623 A1* | 7/2008 | Tachibana et al. ............ | 257/103 |
| 2008/0230792 A1* | 9/2008 | Jiang et al. ...................... | 257/94 |
| 2008/0254562 A1* | 10/2008 | Yajima et al. .................. | 438/46 |
| 2009/0065794 A1* | 3/2009 | Yu et al. ......................... | 257/98 |

FOREIGN PATENT DOCUMENTS

| | | |
|---|---|---|
| JP | 10-242516 A | 9/1998 |
| JP | 2000-174339 A | 6/2000 |
| JP | 2001-291899 A | 10/2001 |
| JP | 2004-193338 A | 7/2004 |
| JP | 2004-200303 A | 7/2004 |
| JP | 2004-296979 A | 10/2004 |
| JP | 2006-66903 | 3/2006 |
| JP | 2006-237574 A | 9/2006 |
| JP | 2008-060331 A | 3/2008 |
| JP | 4089194 | 3/2008 |
| KR | 10-2007-0041506 | 4/2007 |

OTHER PUBLICATIONS

International Search Report issued on Dec. 8, 2009 for PCT/JP09/005955 filed Nov. 9, 2009, with English Translation.
International Written Opinion issued on Dec. 8, 2009 for PCT/JP09/005955 filed Nov. 9, 2009.
Office Action issued Jul. 31, 2013, in Korean Patent Application No. 10-2013-7013942 with English translation.
Notice of Preliminary Rejection issued Sep. 14, 2012 in Korean Patent Application No. 10-2011-7019337 (with English translation).
U.S. Appl. No. 13/029,462, filed Feb. 17, 2011, Sato, et al.
Office Action issued Feb. 28, 2013 in Korean Patent Application No. 10-2011-7019337 with English language translation.
Japanese Office Action issued Dec. 26, 2102 in Patent Application No. 2009-038591 with English Translation.

* cited by examiner

NITRIDE LED WITH A SCHOTTKY ELECTRODE PENETRATING A TRANSPARENT ELECTRODE

CROSS-REFERENCE TO RELATED APPLICATIONS

This is a continuation application of International Application No. PCT/JP2009/005955, filed on Nov. 9, 2009. This application also claims priority to Japanese Application No. 2009-038591, filed on Feb. 20, 2009. The entire contents of each are incorporated herein by reference.

FIELD

Embodiments described herein relate generally to a semiconductor light emitting device, a semiconductor light emitting apparatus, and a method for manufacturing a semiconductor light emitting device.

BACKGROUND

There are demands for highly efficient light emitting devices such as LEDs (Light Emitting Diodes).

In LEDs, for example, a p-type GaN layer, an active layer, and an n-type GaN layer are stacked, and a current is injected from a p-side electrode connected to the p-type GaN layer and from an n-side electrode connected to the n-side GaN layer to a semiconductor layer. As a result, light is emitted at the active layer. In LEDs using, for example, sapphire for a substrate, the p-side electrode and the n-side electrode are often provided on a surface located on the same side, and light is extracted from the surface on the side of these electrodes.

Generally, for example, a transparent electrode made of metal oxide or the like is used for the p-side electrode, in order to extract light from the surface on the electrode side. However, because the conductivity of the metal oxide is one or more digits smaller than that of typical metals, it is difficult to uniformly inject a current into the active layer. Concerning this, a technique is disclosed in which, for example, a pad electrode in a narrow line is formed on a transparent electrode to make the expansion of a current uniform (for example, see Japanese Patent No. 4089194). At this time, because the material used for the pad electrode is selected in terms of electrical connection characteristics, optical absorption is generally high. As a result, when the area of the pad electrode is increased in order to make the current injection region uniform for efficient current injection, the amount of light to be absorbed at the pad electrode increases. Therefore, in such configurations, there is a tradeoff between increases in current injection efficiency and in light extraction efficiency, so that there is a limitation on the improvement of efficiency.

On the other hand, a technique is disclosed in which current paths are controlled to increase efficiency by designing the shape of an electrode, using a Schottky electrode for a part of the electrode, using a current blocking layer, or the like, in a semiconductor light emitting device (for example, see JP-A 2000-174339 (Kokai)). However, in this case as well, no consideration is given to the characteristics, shapes, layout, etc of the electrode contacted with the semiconductor layer and the pad electrode disposed on the electrode. Thus, the problem of a decrease in efficiency due to light absorption of the pad electrode is not yet solved.

As described above, it is difficult for conventional techniques to improve light extraction efficiency while increasing current injection efficiency.

DETAILED DESCRIPTION

In general, according to one embodiment, a semiconductor light emitting device includes a stacked structural body, a first electrode, a second electrode, a third electrode, and a fourth electrode. The stacked structural body includes a first semiconductor layer, a second semiconductor layer, and a light emitting layer provided between the first semiconductor layer and the second semiconductor layer. The first electrode is electrically connected to the first semiconductor layer. The second electrode forms an ohmic contact with the second semiconductor layer. The second electrode is translucent to light emitted from the light emitting layer. The third electrode penetrates through the second electrode and is electrically connected to the second electrode to form Shottky contact with the second semiconductor layer. The third electrode is disposed between the fourth electrode and the second semiconductor layer. A shape of the fourth electrode as viewed along a stacking direction of the first semiconductor layer, the light emitting layer, and the second semiconductor layer is same as a shape of the third electrode as viewed along the stacking direction.

Embodiments will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing

First Embodiment

Figure 1A:
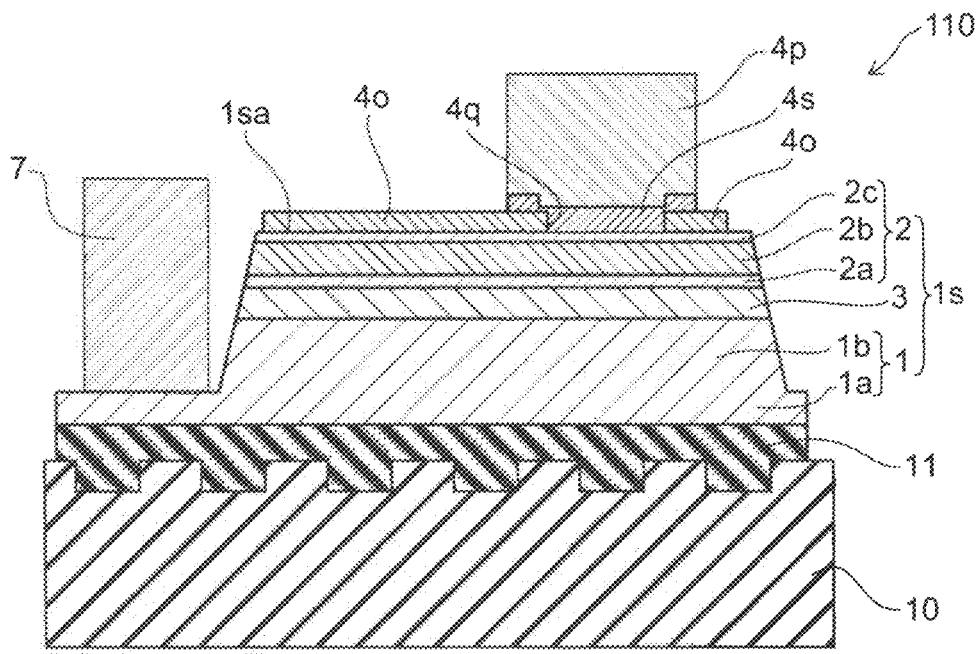
FIGS. 1A and 1B are schematic views illustrating the configuration of a semiconductor light emitting device according to a first embodiment.
Figure 1B:
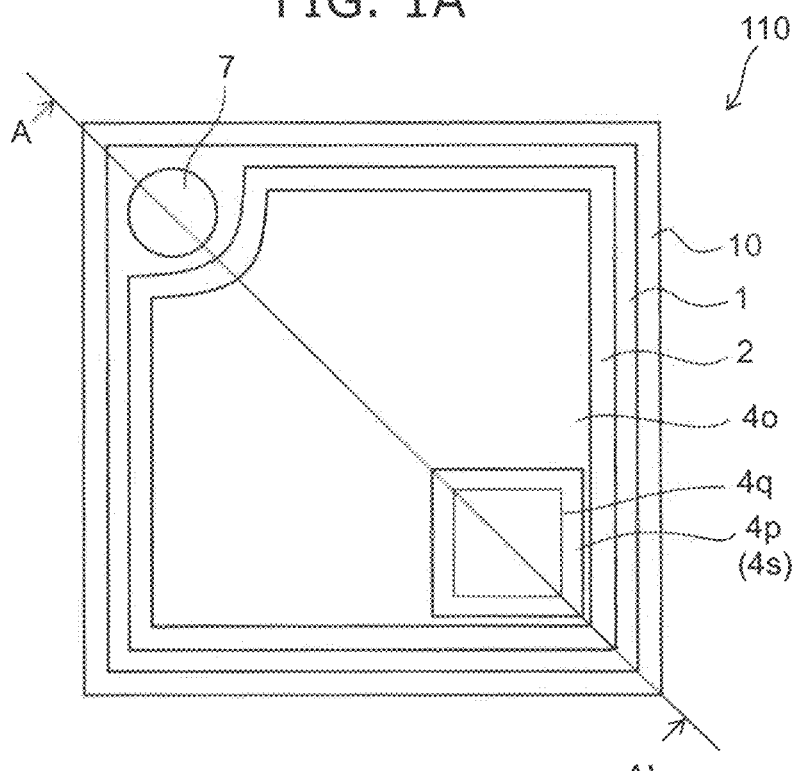

FIGS. 1A and 1B are schematic views illustrating the configuration of a semiconductor light emitting device according to a first embodiment.

More specifically, FIG. 1B is a plan view, and FIG. 1A is a cross-sectional view along line A-A' of FIG. 1B.

As illustrated in FIGS. 1A and 1B, a semiconductor light emitting device 110 according to the first embodiment includes a stacked structural body 1s having an n-type semiconductor layer 1, a p-type semiconductor layer 2, and a light emitting layer 3 provided between the n-type semiconductor layer 1 and the p-type semiconductor layer 2.

In this specific example, the n-type semiconductor layer 1 is a first semiconductor layer, and the p-type semiconductor layer is a second semiconductor layer.

In this specific example, the stacked structural body 1s has a structure in which the p-type semiconductor layer 2 and the light emitting layer 3 are selectively removed, and the n-type semiconductor layer 1 is partially exposed at a first major surface 1sa on the p-type semiconductor layer 2 side.

In the semiconductor light emitting device 110, an n-side electrode 7 electrically connected to the n-type semiconductor layer 1 is provided.

For example, the light emitting layer 3 is provided between a part of the n-type semiconductor layer 1 and the p-type semiconductor layer 2. An n-side electrode 7 is provided on a portion of the n-type semiconductor layer 1 with which the light emitting layer 3 is in contact. The stacked structural body is has the first major surface 1sa on the p-type semiconductor layer 2 (second semiconductor layer) side. The n-type semiconductor layer 1 (first semiconductor layer) is partially exposed at the first major surface 1sa. The n-side electrode 7 is in contact with the exposed part described above.

An ohmic electrode 40 is provided to form ohmic contact with the p-type semiconductor layer 2. The ohmic electrode 4o is translucent to the light emitted from the light emitting layer 3. The ohmic electrode 4o is electrically connected to the p-type semiconductor layer 2.

A Schottky electrode 4s is provided. The Schottky electrode 4s penetrates through the ohmic electrode 4o and is electrically connected to the ohmic electrode 4o. The Schottky electrode 4s forms Shottky contact with the p-type semiconductor layer 2. In addition, it is sufficient that at least a part of the Schottky electrode 4s penetrates through the ohmic electrode 4o. For example, a part of the Schottky electrode 4s may be provided around the outer edge of the ohmic electrode 4o on the p-type semiconductor layer 2 to form Shottky contact with the p-type semiconductor layer 2.

A pad electrode 4p is provided on the Schottky electrode 4s.

More specifically, the pad electrode 4p is formed on a side of the Schottky electrode opposite to the p-type semiconductor layer 2. The pad electrode 4p has the same shape as that of the Schottky electrode 4s as viewed along a stacking direction of the n-type semiconductor layer, the light emitting layer 3, and the p-type semiconductor layer 2 (i.e., the direction perpendicular to the first major surface 1sa).

For example, as described below, a film to be the pad electrode 4p and a film to be the Schottky electrode 4s are formed, and the films are collectively processed in the same pattern. As a result, it is possible to provide the pad electrode 4p and the Schottky electrode 4s in the same planar configuration.

In this specific example, the above-mentioned n-side electrode 7 is a first electrode, the ohmic electrode 4o is a second electrode, the Schottky electrode 4s is a third electrode, and the pad electrode 4p is a fourth electrode.

The Schottky electrode 4s (third electrode) is disposed between the pad electrode 4p (fourth electrode) and the p-type semiconductor layer 2 (second semiconductor layer). The shape of the fourth electrode as viewed along the stacking direction is the same as the shape of the third electrode as viewed along the stacking direction.

The fourth electrode can be used for a pad electrode. More specifically, the pad electrode 4p is disposed with wires for wiring materials or bumps for flip-chip packaging, for example, through which a current is carried.

In this specific example, the n-side electrode 7 and the Schottky electrode 4s (and the pad electrode 4p) are diagonally located on the semiconductor light emitting device 110 as viewed along a direction perpendicular to the first major surface 1sa. However, as described below, the layout and planar configurations of the n-side electrode 7 and the Schottky electrode 4s are arbitrary, and various modifications are possible.

The stacked structural body 1s is provided on a substrate 10 made of sapphire, for example. In this specific example, for the purpose of improving light extraction efficiency, the substrate 10 is provided with projections and depressions. However, it is possible to provide these projections and depressions as necessary. No projections and depressions may be provided.

On the substrate 10, a non-doped GaN buffer layer 11, for example, is provided, and the n-type semiconductor layer 1 made of n-type GaN, for example, is provided thereon. In this specific example, the p-type semiconductor layer 2 and the light emitting layer 3 are selectively removed, and the n-type semiconductor layer 1 is partially exposed at the first major surface is a on the p-type semiconductor layer 2 side. This exposed portion is now referred to as a lower n-type semiconductor layer 1a, and the portion of the n-type semiconductor layer 1 above the lower n-type semiconductor layer 1a is referred to as an upper n-type semiconductor layer 1b. In other words, the n-type semiconductor layer 1 includes the lower n-type semiconductor layer 1a and the upper n-type semiconductor layer 1b.

The n-side electrode 7 is provided on the lower n-type semiconductor layer 1a. For the n-side electrode 7, a Ti/Al material, for example, can be used. More specifically, a Ti/Al/Pt stacked film (Ti is disposed on the n-type semiconductor layer 1 side) can be used. However, the embodiment is not limited thereto. Any material can be used for the n-side electrode 7. For example, any material that forms ohmic contact with the n-type semiconductor layer 1 and any configuration such as a single layer or stacked one are applicable. In the case where a Ti/Al/Pt stacked film is used for the n-side electrode 7, it is made possible to improve the ohmic contact characteristics between the n-type semiconductor layer 1 and the n-side electrode 7, in which the stacked film is formed and then annealed at a temperature of 650° C. in a nitrogen atmosphere.

The light emitting layer 3 (active layer) made of InGaN, for example, is provided on the n-type semiconductor layer 1. In the light emitting layer 3, the single quantum well (SQW) structure or multiple quantum well (MQW) structure is adoptable. The peak light emission wavelength of the light emission wavelength of the light emitting layer 3 ranges from 370 to 400 nm, for example. However, the embodiment is not limited thereto. The light emission wavelength of the light emitting layer 3 is arbitrary.

On the light emitting layer 3, for example, a p-type AlGaN cladding layer 2a, a p-type GaN layer 2b, and a high-concentration doped p-type GaN layer 2c are provided. The p-type semiconductor layer 2 includes the p-type AlGaN cladding layer 2a, the p-type GaN layer 2b, and the high-concentration doped p-type GaN layer 2c.

The ohmic electrode 4o is provided on the p-type semiconductor layer 2. For the ohmic electrode 4o, ITO (Indium-Tin Oxide), for example, is used. For example, after the ITO film is formed on the p-type semiconductor layer 2 by, for example, vapor deposition, the ITO film is heated at high temperature, e.g., temperatures of 300° C. to 800° C., more preferably, a temperature of about 700° C. As a result, ohmic contact between the ohmic electrode 4o and the p-type semiconductor layer 2 is obtained.

In addition, the embodiment is not limited thereto. It is possible that the ohmic electrode 4o includes at least one oxide selected from the group consisting of In, Zn, Sn, Ni, Mg, Cu, Au, Pd, Rh, and Ga, which are translucent to the light emitted from the light emitting layer 3.

For the ohmic electrode 4o, it is possible to use any material having a band gap greater than the light emission wavelength of the light emitting layer 3, in order to provide translucency. It is also possible to use such a metal film that the film thickness is much thinner than the inverse of the absorption coefficient in the light emission wavelength.

Furthermore, in order to provide translucency, it is possible to use such one for the ohmic electrode 4o that a plane pattern is formed in a narrow line or mesh form and the pattern is provided with openings for allowing the emitted light to pass therethrough, while the transmittance to the emitted light is relatively low.

As a result, the transmittance of the ohmic electrode 4o to the light emitted from the light emitting layer 3 is set higher than the transmittance of the Schottky electrode 4s to the light emitted from the light emitting layer 3.

For example, an opening 4q is provided in a part of the ohmic electrode 4o, and the Schottky electrode 4s is provided on the p-type semiconductor layer 2 in this opening 4q. For the Schottky electrode 4s, Al, for example, can be used. As a result, Schottky contact between the Schottky electrode 4s and the p-type semiconductor layer 2 is obtained.

However, the embodiment is not limited thereto. It is possible that the Schottky electrode 4s includes at least one selected from the group consisting of Al, Ag, and Rh, which can form Shottky contact with the p-type semiconductor layer 2.

Desirably, to the Schottky electrode 4s, such a material that has a high transmittance to the emitted light is applied. For example, desirably, the reflectance of the Schottky electrode 4s to the light emitted from the light emitting layer 3 is 80% or more. This can be realized by using, for example, Al, Ag, Rh, or the like, mentioned above, for the Schottky electrode 4s.

For the pad electrode 4p provided on the Schottky electrode 4s, Ti/Pt/Au or Ni/Au, for example, can be used. More specifically, for the pad electrode, it is possible to use such a stacked film that Au, for example, which has an excellent electrical connection, is disposed on the upper side (a side opposite to the stacked structural body 1s) and Ni, Ti, or the like, which has a high adhesion, is disposed on the lower side (the stacked structural body 1s side).

More specifically, it is possible that the pad electrode 4p includes any one of a stacked body having an Ni layer provided on the third electrode and an Au layer provided on the Ni layer, and a stacked body having a Ti layer provided on the third electrode, a Pt layer provided on the Ti layer, and an Au layer provided on the Pt layer.

At this time, for the pad electrode 4p, right materials are selected from two viewpoints of adhesion to the Schottky electrode 4s and electrical connection to bonding wires, which are later connected, so that the reflectance to the light emitted from the light emitting layer 3 is relatively low.

On the other hand, as already discussed, a material having a high reflectance to the emitted light is selected for the Schottky electrode 4s. More specifically, the reflectance of the Schottky electrode 4s to the light emitted from the light emitting layer 3 is higher than the reflectance of the pad electrode 4p to the light emitted from the light emitting layer 3.

As a result, it is possible that the light emitted at the light emitting layer 3 is efficiently reflected off the Schottky electrode 4s, and emitted through the ohmic electrode 4o of translucency.

In the semiconductor light emitting device 110 according to this embodiment, because the pad electrode 4p of low reflectance has the same planar configuration as that of the Schottky electrode 4s of high reflectance, a reduction in efficiency due to light absorption is suppressed since the light emitted from the light emitting layer 3 does not enter the pad electrode 4p. At this time, because of the ohmic electrode 4o of high translucency, it is possible that light absorption at the ohmic electrode 4o is suppressed as soon as possible and the light is emitted highly efficiently.

Furthermore, because the Schottky electrode 4s forms ohmic contact with the p-type semiconductor layer 2, it is difficult for a current flowing through the pad electrode 4p and the Schottky electrode 4s to directly flow into the p-type semiconductor layer 2, and the current flows into the p-type semiconductor layer 2 through the ohmic electrode 4o connected to the Schottky electrode 4s. Thus, light emission is suppressed in the light emitting layer 3 at the position corresponding to the Schottky electrode 4s, so that light emission is efficiently performed at the light emitting layer 3 corresponding to the ohmic electrode 4o. In other words, it is difficult to perform light emission beneath the Schottky electrode 4s whose translucency is lower than that of the ohmic electrode 4o; the current is injected relatively uniformly from the ohmic electrode 4o to the p-type semiconductor layer 2 at the ohmic electrode 4o of high translucency, and the current is uniformly injected into the light emitting layer 3. Consequently, it is made possible to improve current injection efficiency.

As already explained, the emitted light is efficiently reflected off the Schottky electrode 4s of high reflectance, transmitted through the ohmic electrode 4o, and then extracted.

Comparative Example

Figure 2A:
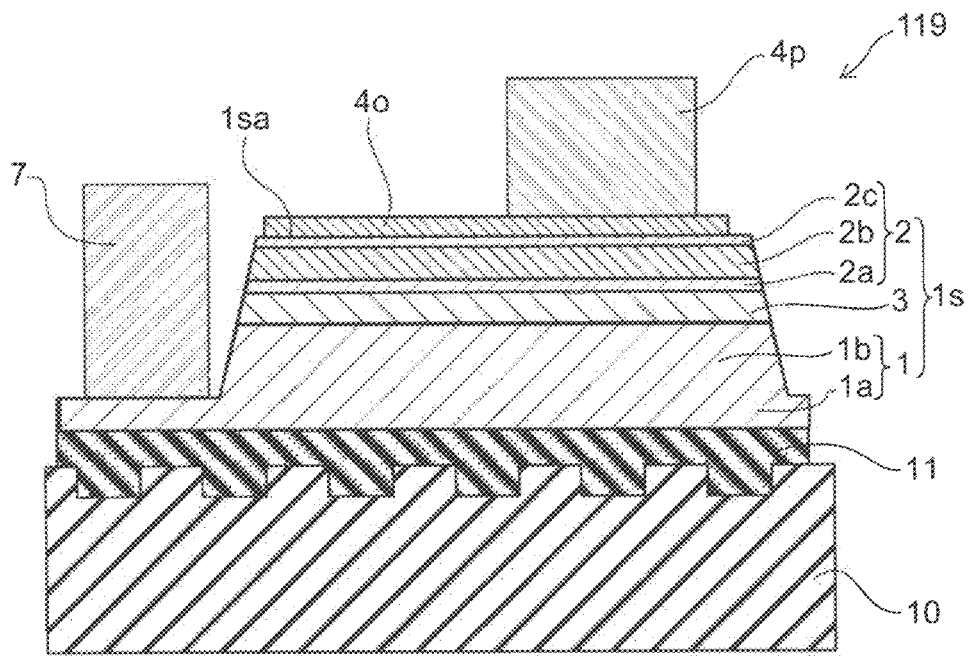
FIGS. 2A and 2B are schematic views illustrating the configuration of a semiconductor light emitting device of a comparative example.
Figure 2B:
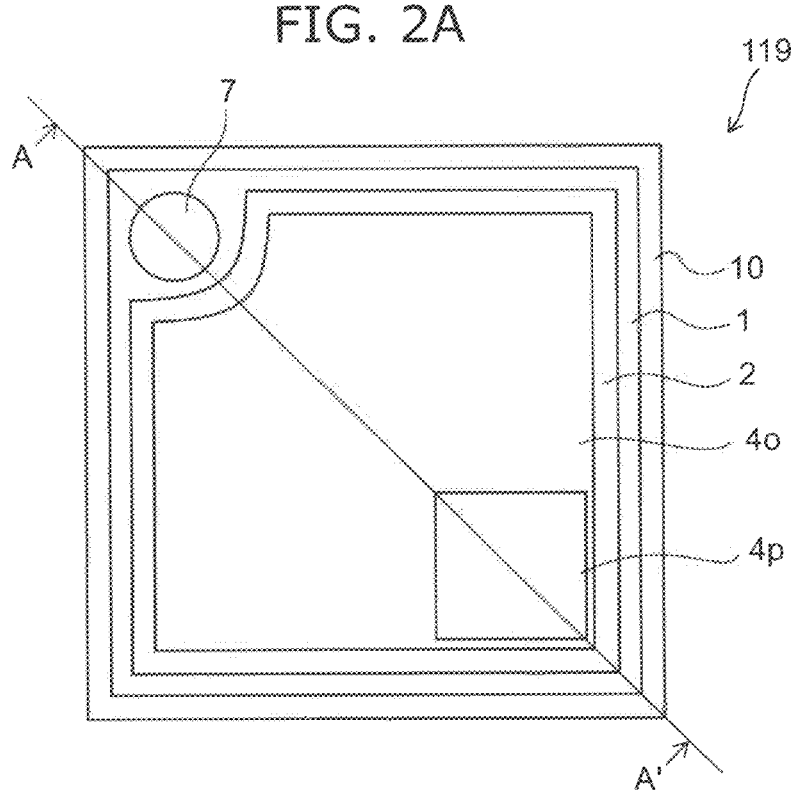

FIGS. 2A and 2B are schematic views illustrating the configuration of a semiconductor light emitting device of a comparative example.

More specifically, FIG. 2B is a plan view, and FIG. 2A is a cross-sectional view along line A-A' of FIG. 2B.

As illustrated in FIGS. 2A and 2B, in a semiconductor light emitting device 119 of the comparative example, the Schottky electrode 4s is not provided. In other words, the opening 4q is not provided in the ohmic electrode 4o, the ohmic electrode 4o is provided almost over the entire surface of the p-type semiconductor layer 2, and the pad electrode 4p is provided on one part thereof. Other than these, the structure is the same as that of the semiconductor light emitting device 110.

In the semiconductor light emitting device 119, because the Schottky electrode 4s is not provided, a current flowing from the pad electrode 4p into the ohmic electrode 4o flows into almost the entire surface of the light emitting layer 3 through the p-type semiconductor layer 2. As a result, light is emitted at almost the entire surface of the light emitting layer 3. More specifically, light is also emitted at the light emitting layer 3 beneath the pad electrode 4p of low translucency, and a large part of this light is absorbed by the pad electrode 4p of low light reflectance. Thus, the light cannot be extracted to the exterior of the device. Furthermore, a part of the light emitted at the light emitting layer 3 corresponding to the portion other than the portion beneath the pad electrode 4p reflects off the interface on the substrate 10 side, for example, and enters the pad electrode 4p for absorption.

As described above, because the Schottky electrode 4s is not provided in the semiconductor light emitting device 119 of the comparative example, the current injection region cannot be controlled; current injection efficiency is low; and light extraction efficiency is also low.

In contrast to this, in the semiconductor light emitting device 110, the Schottky electrode 4s of high reflectance, which has the same planar configuration as that of the pad electrode 4p and forms Schottky contact, is inserted between the pad electrode 4p and the p-type semiconductor layer 2. Accordingly, it is made possible to provide a semiconductor light emitting device that improves light extraction efficiency while increasing current injection efficiency.

In addition, desirably, the planar configuration of the Schottky electrode 4s is the same as the planar configuration of the pad electrode 4p so that the light emitted from the light emitting layer 3 does not enter the pad electrode 4p. More specifically, in the case where the pad electrode 4p is larger than the Schottky electrode 4s, the emitted light enters the pad electrode 4p of low reflectance for absorption, resulting in decreased efficiency.

Here, the same planar configuration refers to a state in which the pad electrode 4p is substantially shielded by the Schottky electrode 4s when seen from the light emitting layer 3 side. Here, the term "same" means the inclusion of, for example, variations in processing accuracy in fabrication and differences due to the tapered portion formed in processing, or the like, as well as the case of identical ones. It is sufficient that the planar configuration is substantially the same.

In addition, it is possible to obtain a high light extraction efficiency even in the case where the pad electrode 4p is smaller than the Schottky electrode 4s. However, in practical use of the semiconductor light emitting device 110, it is preferable that the area of the pad electrode 4p is larger as much as possible, so that the pad electrode 4p is designed as large as possible, in order to facilitate the bonding process of bonding wires to the pad electrode 4p and to stabilize bonding by increasing the bonding area. Thus, in order to achieve a high light extraction efficiency, facilitated bonding processes, and stabilized bonding, it is desirable that the planar configurations of the pad electrode 4p and the Schottky electrode 4s is designed substantially the same.

Furthermore, in the case where the pad electrode 4p and the Schottky electrode 4s are formed substantially in the same planar configuration, as described below, there is also an advantage that it is possible to collectively process them in the same process for omitting processes.

In addition, the contact resistance of the Schottky electrode 4s to the p-type semiconductor layer 2 can be set to $1.0 \times 10^{-2}$ $\Omega cm^2$ or more, for example. On the other hand, the contact resistance of the ohmic electrode 4s to the p-type semiconductor layer 2 can be set to one tenth or less of the contact resistance between the Schottky electrode 4s and the p-type semiconductor layer 2. Therefore, the current path is correctly controlled for improving current injection efficiency. More specifically, for example, the drive voltage of the semiconductor light emitting device 110 is about 3 V, and the voltage drop when a current of 20 mA is carried is about 0.02 V at this time, so that right driving conditions can be maintained.

In the following, simulation results relating to the effect of improving light extraction efficiency in the semiconductor light emitting device 110 according to this embodiment will be described.

Figure 3:
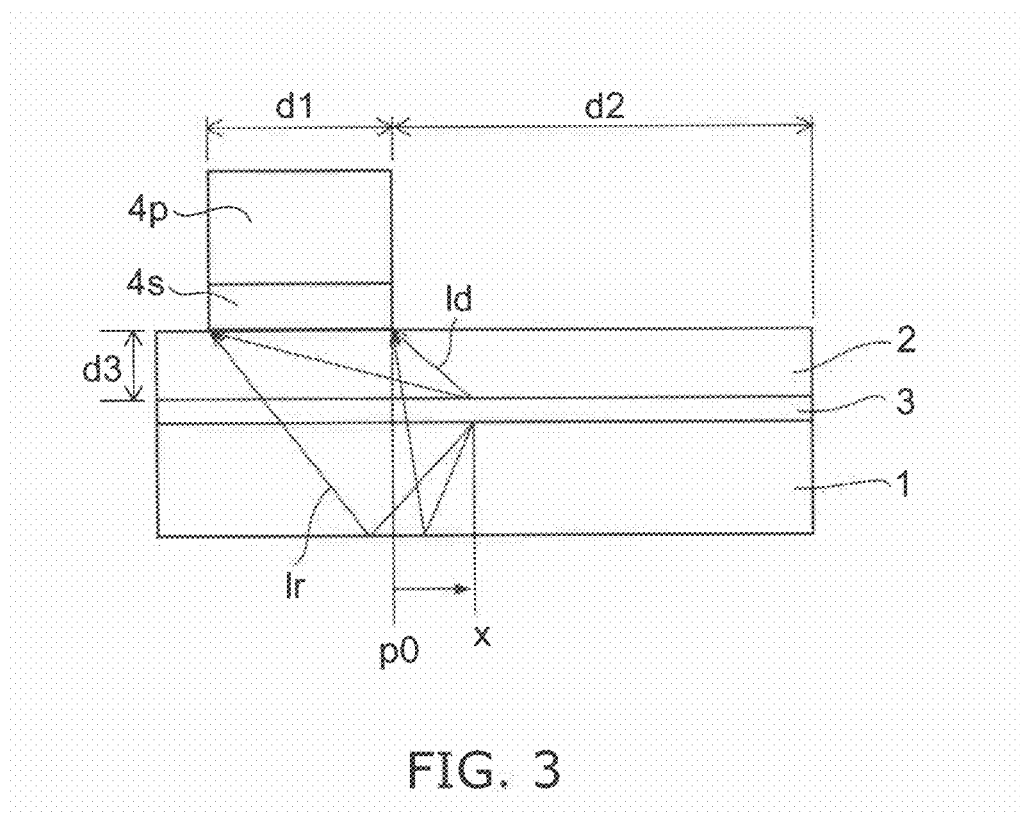
FIG. 3 is a schematic view illustrating a simulation model for the effect of the semiconductor light emitting device according to the first embodiment.

FIG. 3 is a schematic view illustrating a simulation model for the effect of the semiconductor light emitting device according to the first embodiment.

As illustrated in FIG. 3, this simulation adopted a one-dimensional model that the semiconductor light emitting device 110 was simplified. In addition, in FIG. 3, the ohmic electrode 4o is omitted.

In this simulation, a width d1 of the Schottky electrode 4s was 100 μm, a width d2 of the light emitting layer 3 was 100 μm, and a distance d3 between the light emitting layer 3 and the Schottky electrode 4s (i.e., the thickness of the p-type semiconductor layer 2) was 100 nm. The position at the end of the Schottky electrode 4s is an origin point p0, and the distance from the origin point p0 is a distance x. Light Id that is the light, which is emitted at the light emitting layer 3, directly entering from the light emitting layer 3 to the Schottky electrode 4s, and light Ir that is the light reflecting off the back surface and entering the Schottky electrode 4s were determined by simulation as the distance x was varied over the entire width d2 of the light emitting layer 3. At this time, the reflectance at the back surface was 100% for simplification.

As a result, it was shown in this model that the ratio of the amount of the light Id directly entering from the light emitting layer 3 to the Schottky electrode 4s was 0.35% of the total, and the ratio of the amount of the light Ir reflecting off the back surface and entering the Schottky electrode 4s was 8% of the total. More specifically, 8.35% of the light enters from the light emitting layer 3 to the Schottky electrode 4s.

At this time, because the Schottky electrode 4s is not provided in the semiconductor light emitting device 119 of the comparative example, 8.35% of the light enters the pad electrode 4p of low reflectance, and a substantial amount of the light is absorbed into the pad electrode 4p.

In contrast to this, in the semiconductor light emitting device 110 according to this embodiment, 8.35% of the light does not enter the pad electrode 4p, reflects off the Schottky electrode 4s of high reflectance at a high reflectance, and again reflects off the back surface, for example, for efficient extraction.

In the following, an exemplary method for manufacturing the semiconductor light emitting device 110 will be described.

Figure 4A:
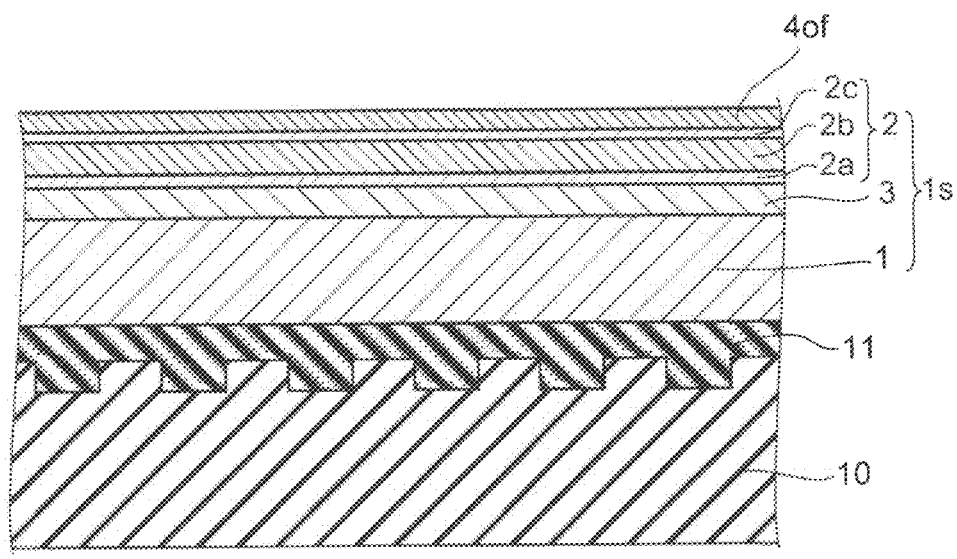
FIGS. 4A and 4B are schematic cross-sectional views in order of processes illustrating a method for manufacturing the semiconductor light emitting device according to the first embodiment.
Figure 4B:
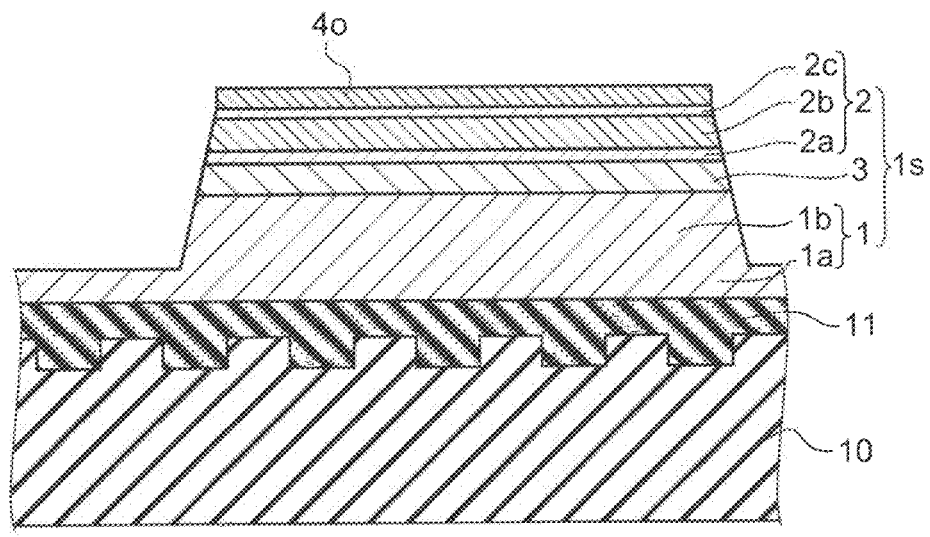

FIGS. 4A and 4B are schematic cross-sectional views in order of processes illustrating the method for manufacturing the semiconductor light emitting device according to the first embodiment.

More specifically, FIG. 4A is a drawing of a first process, and FIG. 4B is a figure subsequent to FIG. 4A.

Figure 5A:
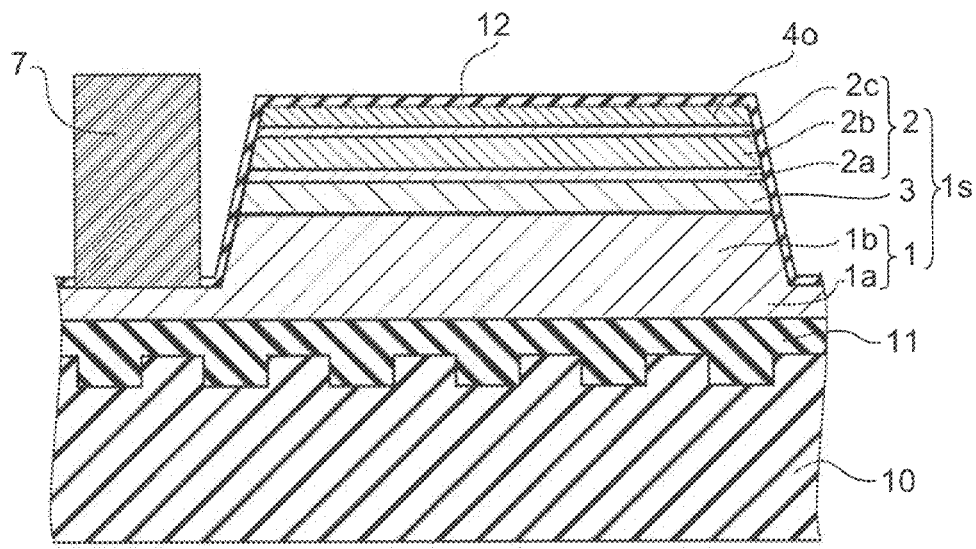
FIGS. 5A and 5B are schematic cross-sectional views in order of processes subsequent to FIG. 4B.
Figure 5B:
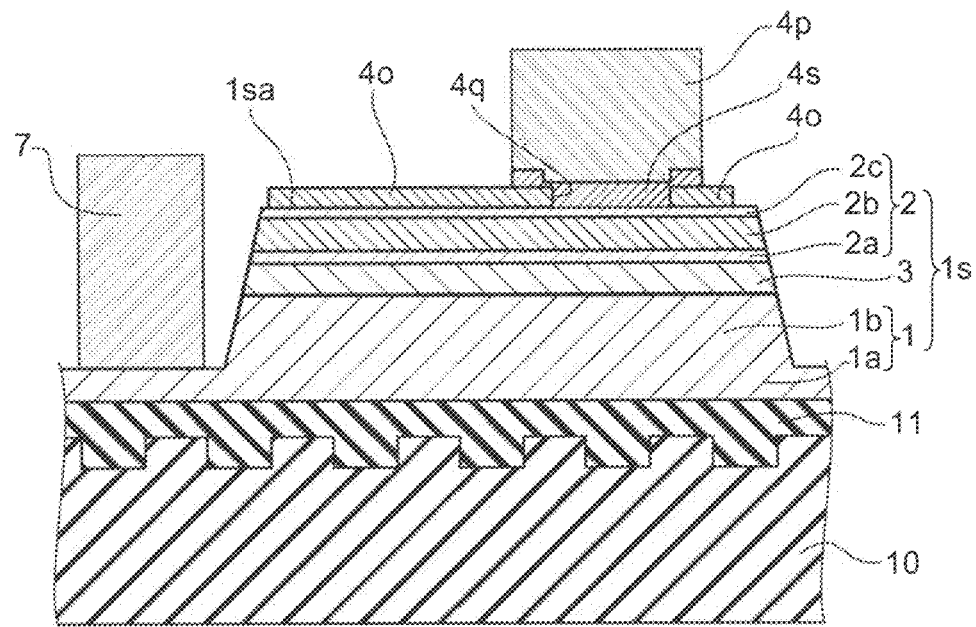

FIGS. 5A and 5B are schematic cross-sectional views in order of processes subsequent to FIG. 4B.

As illustrated in FIG. 4A, on the substrate 10 made of sapphire, for example, the non-doped GaN buffer layer 11 and the n-type semiconductor layer 1 made of an n-type GaN layer, for example, are sequentially formed by, for example, MOCVD (Metal Organic Chemical Vapor Deposition), MBE (Molecular Beam Epitaxy), etc. Subsequently, the light emitting layer 3 made of an InGaN layer, for example, is formed on the n-type semiconductor layer 1 by, for example, MOCVD or MBE. Furthermore, the p-type AlGaN cladding layer 2a, the p-type GaN layer 2b, and the high-concentration doped p-type GaN layer 2c are sequentially formed on the light emitting layer 3 by, for example, MOCVD. Thus, the stacked structural body is constructed.

This stacked structural body 1s is heated in a RTA (Rapid Thermal Annealing) furnace, or the like, for example, for facilitating the p-type activation in the p-type GaN layer 2b.

Subsequently, a transparent metal oxide film 40f made of ITO for the ohmic electrode 4o is formed on the p-type semiconductor layer 2 by, for example, vapor deposition, or the like. The transparent metal oxide film 40f is heated at high temperature, temperatures of 300° C. to 800° C., inclusive, more preferably, around a temperature of 700° C., so that it is possible to obtain ohmic contact with the p-type semiconductor layer 2.

After this, as illustrated in FIG. 4B, the ohmic electrode 4o, the p-type semiconductor layer 2, and the light emitting layer 3 in a certain area, and a part of the n-type semiconductor layer 1 are removed by lithography and etching such as RIE (Reactive Ion Etching) for exposing a part of the n-type semiconductor layer 1. In addition, the etching above is not limited to dry etching such as RIE. It is also possible to perform the etching by wet etching, for example.

After this, as illustrated in FIG. 5A, after an insulating film 12 made of a silicon oxide film or the like, for example, is formed over the entire surfaces of the workpiece by CVD (Chemical Vapor Deposition) or the like, for example, the insulating film 12 on the n-type semiconductor layer 1 is partially removed by lithography and wet etching or the like, and then the n-side electrode 7 made of Ti/Al/Pt is formed by vacuum deposition and lift-off, for example. At this time, annealing is performed at a temperature of 650° C. in a nitrogen atmosphere, for example, so that it is made possible to improve the ohmic contact characteristics between the n-side electrode 7 and the n-type semiconductor layer 1. In addition, the insulating film 12 is removed before this annealing.

After this, as illustrated in FIG. 5B, another insulating film (not shown) is formed, the insulating film on the ohmic electrode 4o is partially removed, and the opening 4q is formed to expose a part of the p-type semiconductor layer 2. An Al film, for example, to be the Schottky electrode 4s and a Ti/Pt/Au stacked film or Ni/Au stacked film, for example, to be the pad electrode 4p are sequentially formed thereon, and these films are collectively processed using the same mask by photolithography for forming the Schottky electrode 4s and the pad electrode 4p. Thus, the Schottky electrode 4s and the pad electrode 4p are processed to have the same planar configuration. For this processing, it is possible to use lift-off. After this, the above-mentioned insulating film is removed, and the shape of the ohmic electrode 4o is processed.

After this, a device isolation trench (not shown) is provided so as to expose the substrate 10 by lithography and RIE, for example, in order to facilitate chip fabrication, and a transparent insulating film (not shown) such as a silicon oxide film, for example, is then formed so as to coat the side surface of the device isolation trench by CVD, sputtering, vapor deposition, etc. The semiconductor light emitting device 110 as illustrated in FIGS. 1A and 1B is then obtained.

In addition, in the case where a metal oxide material of translucency is used for the ohmic electrode 4o, desirably, the ohmic electrode 4o is formed before the process of forming the Schottky electrode 4s and the pad electrode 4p. More specifically, as described above, in order to improve the ohmic contact characteristics, the transparent metal oxide film 4 of is heated at high temperature, temperatures of 300° C. to 800° C., inclusive, more preferably, around a temperature of 700° C., when forming the ohmic electrode 4o. Applying this high temperature heat treatment to the Schottky electrode 4s and the pad electrode 4p causes problems such as migration or the like on the Schottky electrode 4s and the pad electrode 4p. For this reason, desirably, the Schottky electrode 4s and the pad electrode 4p are formed after the ohmic electrode 4o is formed.

In addition, in the case where the Schottky electrode 4s and the pad electrode 4p are formed after the ohmic electrode 4o is formed, the Schottky electrode 4s and the pad electrode 4p are disposed above the ohmic electrode 4o. At this time, in order to excellently maintain the electrical connection between the Schottky electrode 4s and the ohmic electrode 4o, desirably, the Schottky electrode 4s is provided so as to partially cover the ohmic electrode 4o.

However, the embodiment is not limited thereto. The shapes and layout of the Schottky electrode 4s and the ohmic electrode 4o (and the pad electrode 4p) are arbitrary as long as the electrical connection between the Schottky electrode 4s and the ohmic electrode 4o is obtained.

Furthermore, the embodiment is not limited to the description above. The order of forming the ohmic electrode 4o, the Schottky electrode 4s, and the pad electrode 4p is arbitrary, depending on materials and forming methods used for the ohmic electrode 4o, the Schottky electrode 4s, and the pad electrode 4p.

In addition, in the above-mentioned specific example, the stacked structural body 1s is processed to expose a part of the n-type semiconductor layer 1 after forming the material to be the ohmic electrode 4o. However, it is possible to change the order between the process of forming the material to be the ohmic electrode 4o and the process of processing the stacked structural body 1s. Furthermore, the description above is one example of the manufacturing method. It is also possible to change the order of the individual processes within the scope technically feasible.

Additionally, in the semiconductor light emitting device 110 according to this embodiment, it is possible to set the conductivity of the Schottky electrode 4s (third electrode) lower than the conductivity of the ohmic electrode 4o (second electrode). Moreover, it is possible to set the conductivity of the pad electrode 4p (fourth electrode) lower than the conductivity of the ohmic electrode 4o (second electrode). More specifically, setting the conductivity of the ohmic electrode 4o higher allows the voltage drop of the ohmic electrode 4o to be suppressed for improving efficiency.

Figure 6:
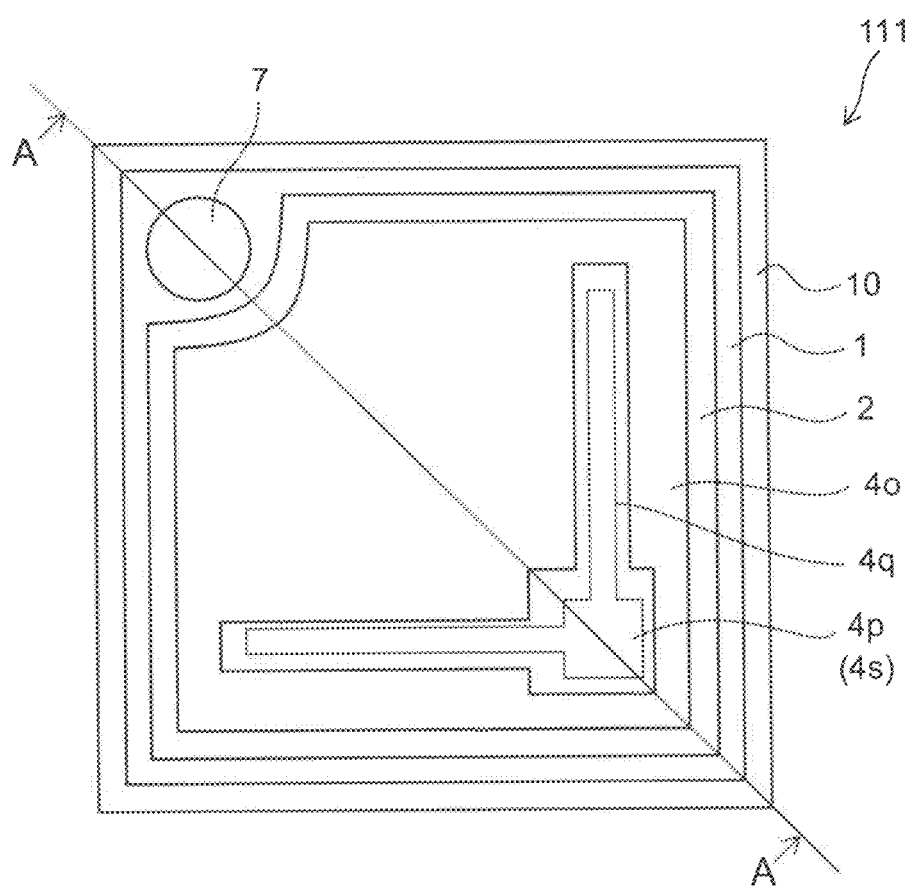
FIG. 6 is a schematic plan view illustrating the configuration of another semiconductor light emitting device according to the first embodiment.

FIG. 6 is a schematic plan view illustrating the configuration of another semiconductor light emitting device according to the first embodiment.

As illustrated in FIG. 6, in another semiconductor light emitting device 111 according to this embodiment, the planar configuration of the Schottky electrode 4s (and the pad electrode 4p) as viewed along the direction perpendicular to the first major surface 1sa is modified from that in the semiconductor light emitting device 110. More specifically, in the semiconductor light emitting device 111, the opening 4q is provided at the opposite angle facing the n-side electrode 7 and along two sides extended from this opposite angle, and the Schottky electrode 4s and the pad electrode 4p are provided in the shape matched with this shape, in the planar configuration of the semiconductor light emitting device 110. As a result, it is possible to shape the current path formed by the Schottky electrode 4s for making the current injection region more uniform.

According to the semiconductor light emitting device 111, it is made possible to provide a semiconductor light emitting device that further increases current injection efficiency and improves light extraction efficiency.

Second Embodiment

In a second embodiment the ohmic electrode and the Schottky electrode are provided for the electrode connected to the n-type semiconductor layer. In this case, light is extracted from the n-type semiconductor layer.

Figure 7A:
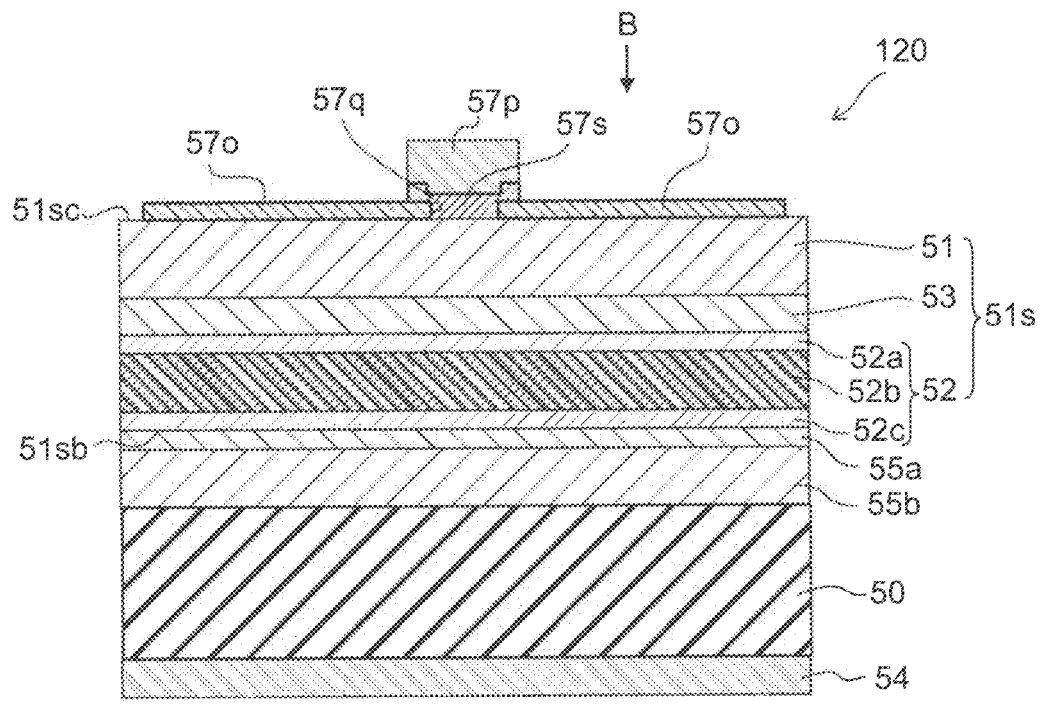
FIGS. 7A and 7B are schematic views illustrating the configuration of a semiconductor light emitting device according to a second embodiment.
Figure 7B:
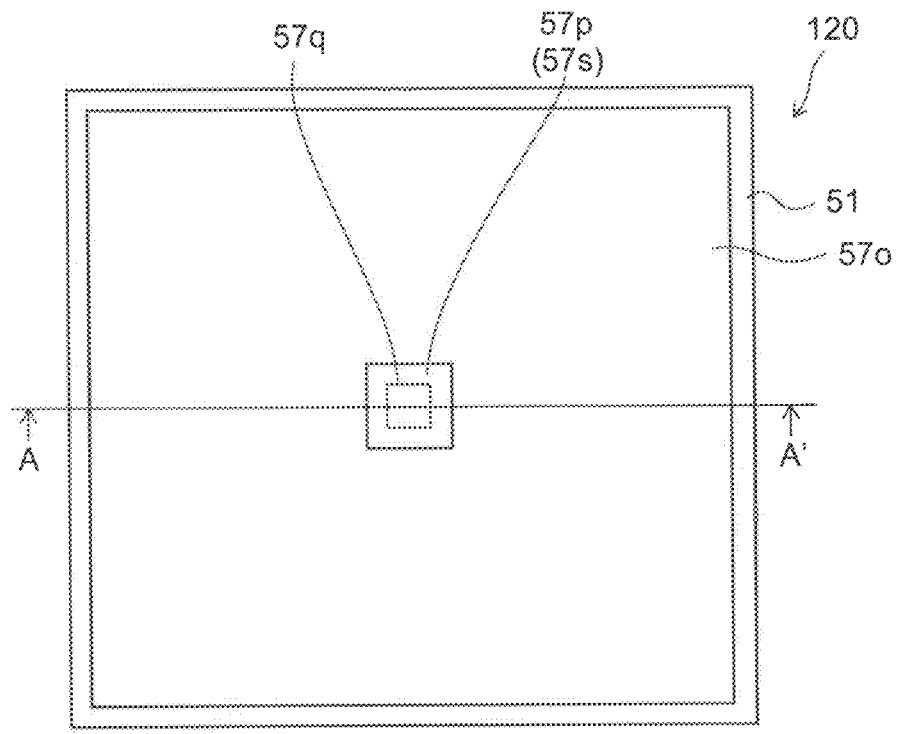

FIGS. 7A and 7B are schematic views illustrating the configuration of a semiconductor light emitting device according to the second embodiment.

More specifically, FIG. 7B is a plan view, FIG. 7A is a cross-sectional view along line A-A' of FIG. 7B. FIG. 7B is a plan view when seen from arrow B of FIG. 7A.

As illustrated in FIGS. 7A and 7B, a semiconductor light emitting device 120 according to this embodiment includes a stacked structural body 51s having a first semiconductor layer (p-type semiconductor layer 52), a second semiconductor layer (n-type semiconductor layer 51), and a light emitting layer 53 provided between the first semiconductor layer and the second semiconductor layer.

Here, in this embodiment, the p-type semiconductor layer 52 is the first semiconductor layer, and the n-type semiconductor layer 51 is the second semiconductor layer.

The p-type semiconductor layer 52 has a p-type AlGaN cladding layer 52a, a p-type GaN layer 52b, and a high-concentration doped p-type GaN layer 52c disposed in order from the light emitting layer 53 side.

In this specific example, on a side of the p-type semiconductor layer 52 opposite to the light emitting layer 53, a p-side contact electrode 55a, a bonding layer 55b, and a conductive substrate 50, for example, are provided in this order. Ag, for example, is used for the p-side contact electrode 55a, Au, for example, is used for the bonding layer 55b, and Si, for example, is used for the substrate 50.

The semiconductor light emitting device 120 further includes a p-side electrode 54 electrically connected to the first semiconductor layer. In this specific example, the p-side electrode 54 is electrically connected to the p-type semiconductor layer 52 through the p-side contact electrode 55a, the bonding layer 55b, and the conductive substrate 50.

The semiconductor light emitting device 120 further includes an ohmic electrode 57o, a Schottky electrode 57s, and a pad electrode 57p.

The ohmic electrode 57o forms ohmic contact with the n-type semiconductor layer 51, and is translucent to the light emitted from the light emitting layer 53.

The Schottky electrode 57s penetrates through the ohmic electrode 57o and is electrically connected to the ohmic electrode 57o to form Shottky contact with the n-type semiconductor layer 51. More specifically, an opening 57q is provided in the ohmic electrode 57o, and the Schottky electrode 57s and the n-type semiconductor layer 51 form Shottky contact in this opening 57q. In addition, it is sufficient that at least one part of the Schottky electrode 57s penetrates through the ohmic electrode 57o.

The pad electrode 57p is formed on a side of the Schottky electrode 57s opposite to the n-type semiconductor layer 51, and has the same planar configuration as that of the Schottky electrode 57s as viewed along a stacking direction of the p-type semiconductor layer 52, the light emitting layer 53, and the n-type semiconductor layer 51.

Here, in this embodiment, the p-side electrode 54 is a first electrode, the ohmic electrode 57o is a second electrode, the Schottky electrode 57s is a third electrode, and the pad electrode 57p is a fourth electrode.

More specifically, in the semiconductor light emitting device 120, the first semiconductor layer is the p-type semiconductor layer 52, and the second semiconductor layer is the n-type semiconductor layer 51. The first electrode is provided on a side of the second major surface 51sb of the stacked structural body 51s on the first semiconductor layer side. The second, third, and fourth electrodes are provided on a side of the third major surface 51sc of the stacked structural body 51s on the second semiconductor layer side.

For the n-type semiconductor layer 51, the light emitting layer 53, the p-type semiconductor layer 52, the ohmic electrode 57o, the Schottky electrode 57s, and the pad electrode 57p, the configurations and materials similar to those of the n-type semiconductor layer 1, the light emitting layer 3, the p-type semiconductor layer 2, the ohmic electrode 4o, the Schottky electrode 4s, and the pad electrode 4p can be applied, which are described in the first embodiment. However, for the p-side electrode 54 in the semiconductor light emitting device 120, for example, Ti/W or the like can be used.

The ohmic electrode 57o, the Schottky electrode 57s, and the pad electrode 57p can exert the effect similar to that in the first embodiment. Therefore, it is made possible to provide a semiconductor light emitting device that improves light extraction efficiency while increasing current injection efficiency, by the semiconductor light emitting device 120.

Figure 8A:
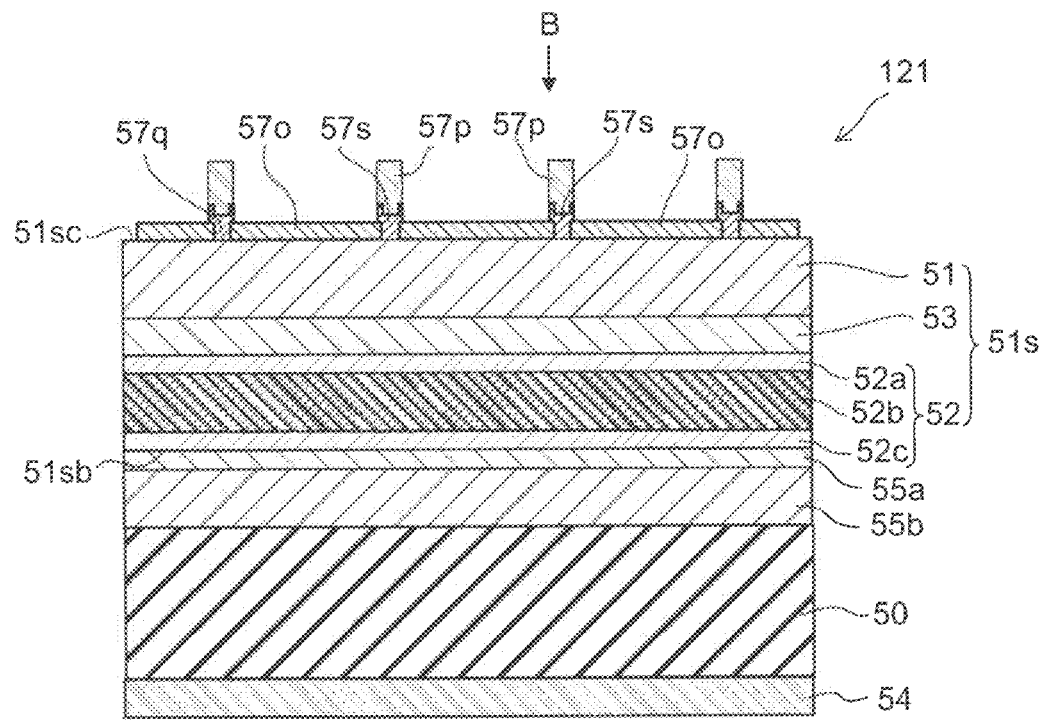
FIGS. 8A and 8B are schematic views illustrating the configuration of another semiconductor light emitting device according to the second embodiment.
Figure 8B:
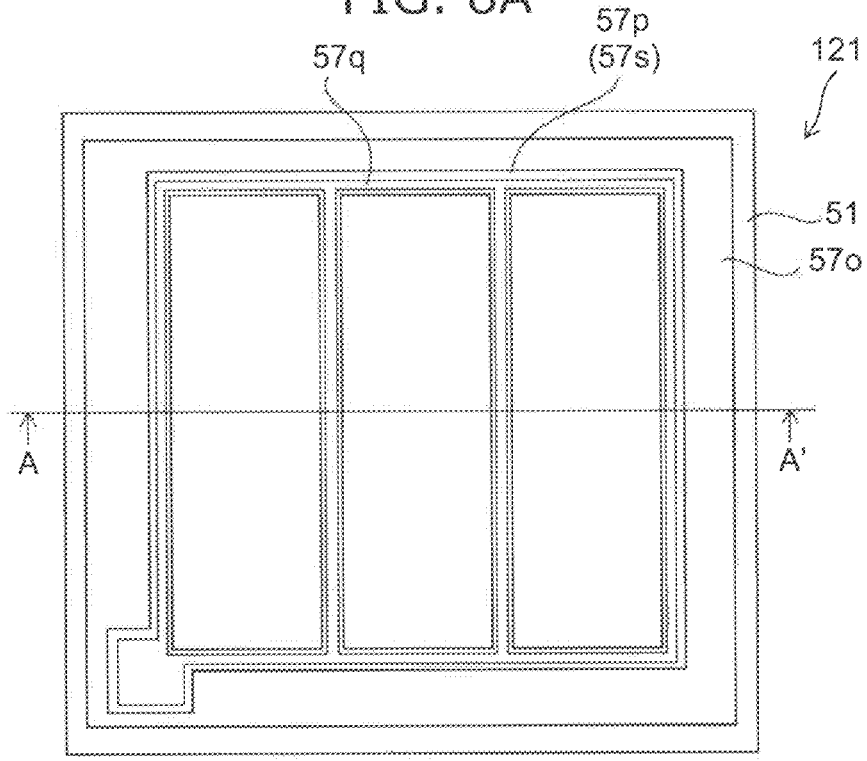

FIGS. 8A and 8B are schematic views illustrating the configuration of another semiconductor light emitting device according to the second embodiment.

More specifically, FIG. 8B is a plan view, and FIG. 8A is a cross-sectional view along line A-A' of FIG. 8B. FIG. 8B is a plan view when seen from arrow B of FIG. 8A.

As illustrated in FIGS. 8A and 8B, in another semiconductor light emitting device 121 according to this embodiment, a Schottky electrode 57s (and a pad electrode 57p) has such a shape that a plurality of narrow lines are surrounded by a frame. An ohmic electrode 57o is provided on the inside surrounded by the narrow lines and the frame and on the outside of the frame.

In this case as well, it is made possible to provide a semiconductor light emitting device that improves light extraction efficiency while increasing current injection efficiency.

As described above, the ohmic electrode 57o, the Schottky electrode 57s, and the pad electrode 57p can be formed in any shapes.

In addition, in the case where the ohmic electrode 57o is provided on the n-type semiconductor layer 51 side, a current can be uniformly injected even when the ohmic electrode 57o is not provided over the entire surface because the resistance of the n-type semiconductor layer 51 is relatively low. Therefore, the ohmic electrode 57o may be or may not be provided over the entire surface, and a metal film having its plane pattern in a narrow line or mesh form can also be used for the ohmic electrode 57o.

Third Embodiment

A third embodiment is a method for manufacturing a semiconductor light emitting device. In the following, a method for manufacturing the semiconductor light emitting device 110 according to the first embodiment is taken as an example for explanation.

More specifically, the method for manufacturing a semiconductor light emitting device according to this embodiment is a method for manufacturing a semiconductor light emitting device, the device including: the stacked structural body is having the first semiconductor layer (n-type semiconductor layer 1), the second semiconductor layer (p-type semiconductor layer 2), and the light emitting layer 3 provided between the first semiconductor layer and the second semiconductor layer; the first electrode (n-side electrode 7) electrically connected to the first semiconductor layer; the second electrode (ohmic electrode 4o) that forms ohmic contact with the second semiconductor layer and is translucent to the light emitted from the light emitting layer; the third electrode (Schottky electrode 4s) penetrating through the second electrode and electrically connected to the second electrode to form Shottky contact with the second semiconductor layer; and the fourth electrode (pad electrode 4p) formed on a side of the third electrode opposite to the second semiconductor layer.

In the following, the features of the method for manufacturing a semiconductor light emitting device according to this embodiment will be described.

Figure 9:
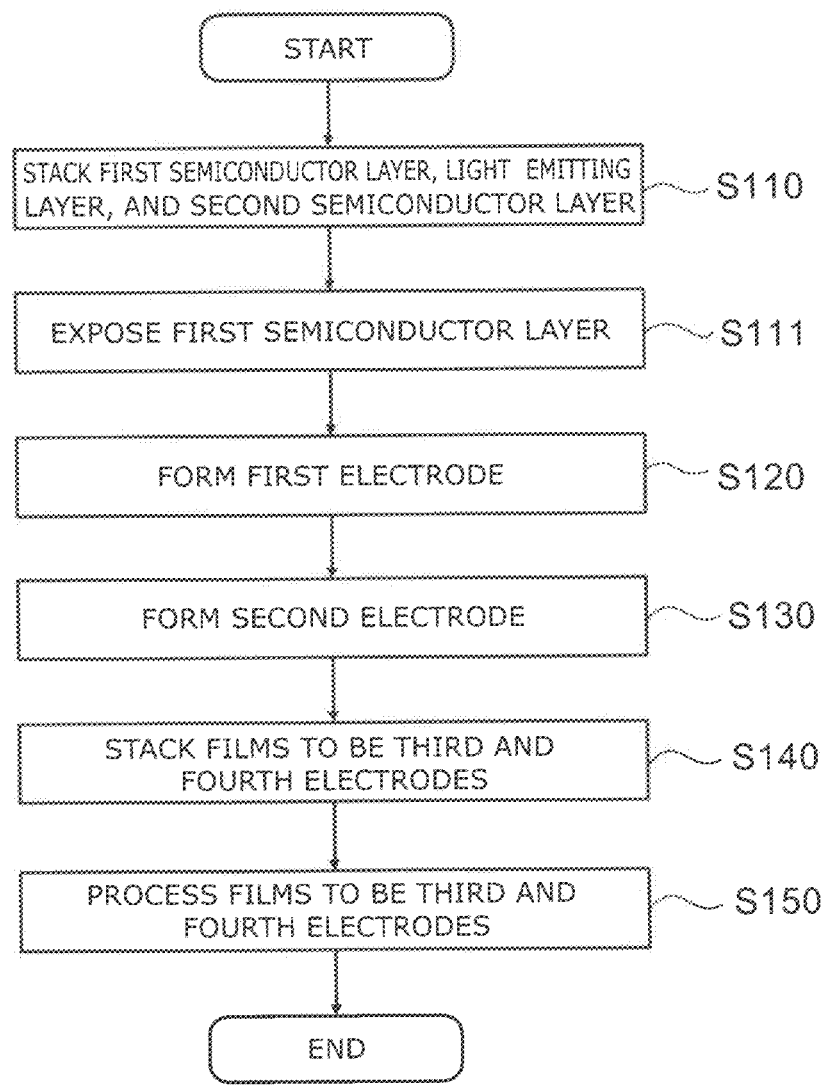
FIG. 9 is a flowchart illustrating a method for manufacturing a semiconductor light emitting device according to a third embodiment.

FIG. 9 is a flowchart illustrating the method for manufacturing a semiconductor light emitting device according to the third embodiment.

As illustrated in FIG. 9, in the method for manufacturing a semiconductor light emitting device according to this embodiment, the first semiconductor layer, the light emitting layer, and the second semiconductor layer are stacked (Step S110). For example, the method described in relation to FIG. 4A can be adopted. Thereby, the stacked structural body is formed.

The first semiconductor layer is exposed as necessary (Step S111). In addition, in fabricating the semiconductor light emitting device 120 according to the second embodiment, Step S111 is omitted.

The first electrode (e.g., the n-side electrode 7) is formed on the first semiconductor layer (e.g., the n-type semiconductor layer 1) (Step S120).

The second electrode (e.g., the ohmic electrode 4o) is formed on the second semiconductor layer (e.g., the p-type semiconductor layer 2) (Step S130).

At this time, the order of Step S120 and Step S130 mentioned above can be changed. For example, the method described in relation to FIGS. 4B and 5B can be adopted.

On the second semiconductor layer exposed from the second electrode, a film to be the third electrode and a film to be the fourth electrode are stacked (Step S140).

The film to be the third electrode and the film to be the fourth electrode are collectively processed using the same mask (Step S150).

In Step S140 and Step S150 mentioned above, the method described in relation to FIG. 5B, for example, can be adopted.

More specifically, for example, the insulating film on the ohmic electrode 4o is partially removed, the opening 4q is formed, a part of the p-type semiconductor layer 2 is exposed, and an Al film to be the Schottky electrode 4s, a Ti/Pt/Au stacked film to be the pad electrode 4p, and the like are sequentially formed thereon. These films are collectively processed by lift-off, for example, using the same mask, to form the Schottky electrode 4s and the pad electrode 4p.

Thus, the Schottky electrode 4s and the pad electrode 4p are processed to have the same planar configuration.

In Step S130 mentioned above, the second electrode (ohmic electrode 4o) is formed by heating, after forming the film to be the second electrode on the second semiconductor layer. This heat treatment includes heat treatment performed at a temperature not less than 300° C. and not more than 800° C. Consequently, it is possible to obtain an excellent ohmic contact.

In addition, desirably, Step S140 mentioned above (stacking the film to be the third electrode and the film to be the fourth electrode) is performed after Step S130 (forming the second electrode). Thus, high temperature heat treatment in Step S130 is not applied to the film to be the third electrode and the film to be the fourth electrode, so that excellent characteristics can be obtained.

Desirably, Step S140 and Step S150 mentioned above are performed at temperatures lower than the temperatures applied in Step S130 (forming the second electrode).

In addition, as the semiconductor light emitting devices 120 and 121 according to the second embodiment, in the case where the p-side electrode 54 is provided on the second major surface 51sb of the stacked structural body 51s and the ohmic electrode 57o, the Schottky electrode 57s, and the pad electrode 57p are provided on the third major surface 51sc, Step S111 mentioned above is omitted; the p-side contact electrode 55a and the bonding layer 55b are formed on the second major surface 51sb after Step S110, and then the bonding layer 55b is bonded to the substrate 50.

At this time, Ag, for example, is used for the p-side contact electrode 55a, Au, for example, is used for the bonding layer 55b, and Si, for example, is used for the substrate 50.

The sapphire substrate, for example, which is used in constructing the stacked structural body 51s, on the n-type semiconductor layer 51 side of the stacked structural body 51s is removed, and the second electrode (in this case, the ohmic electrode 57o on the n-side) is formed on the surface (third major surface 51sc) (Step S130).

The films to be the third electrode and the fourth electrode (the films to be the Schottky electrode 57s and the pad electrode 57p in this case) are stacked (Step S140), and these films are processed (Step S150).

The first electrode (in this case, the p-side electrode 54) is formed on the first semiconductor layer (in this case, the p-type semiconductor layer 52) (Step S120). At this time, the first electrode (in this case, the p-side electrode 54) is formed on the surface of the conductive substrate 50 opposite to the stacked structural body 51s.

According to the method for manufacturing a semiconductor light emitting device according to this embodiment, it is made possible to provide a method for manufacturing a semiconductor light emitting device that improves light extraction efficiency while increasing current injection efficiency.

Fourth Embodiment

Figure 10:
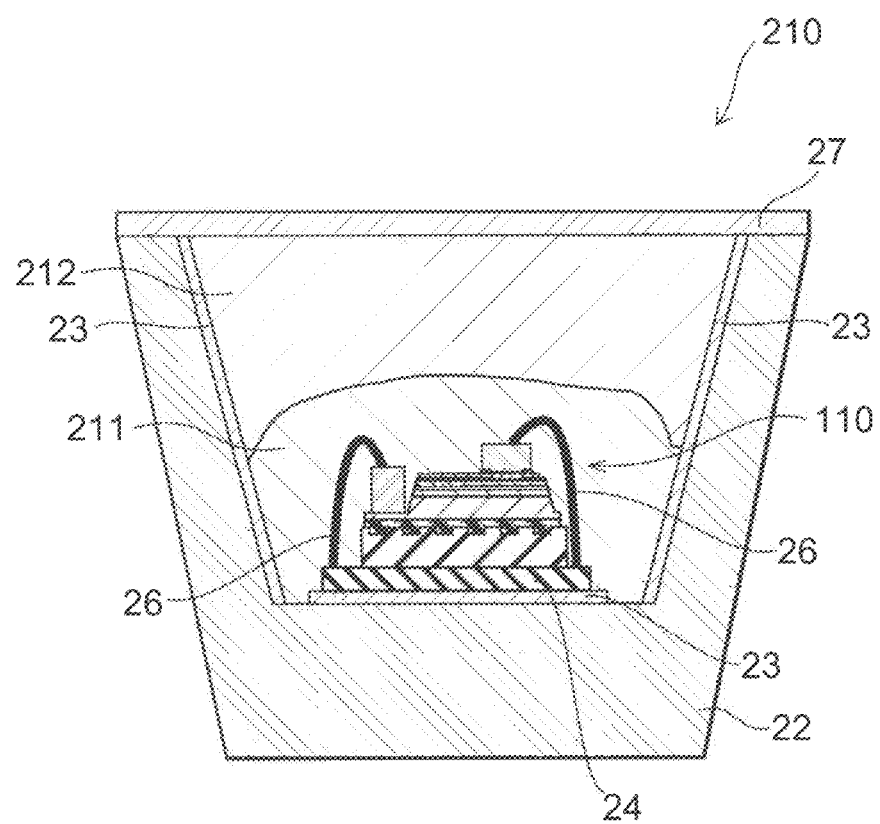
FIG. 10 is a schematic cross-sectional view illustrating the configuration of a semiconductor light emitting apparatus according to a fourth embodiment.

FIG. 10 is a schematic cross-sectional view illustrating the configuration of a semiconductor light emitting apparatus according to a fourth embodiment.

As illustrated in FIG. 10, a semiconductor light emitting apparatus 210 according to the fourth embodiment is a white LED combining a fluorescent body and any of the semiconductor light emitting devices 110, 111, 120, and 121 according to the above-mentioned embodiments and the variations thereof.

In other words, the semiconductor light emitting apparatus 210 according to this embodiment includes any of the above-mentioned semiconductor light emitting devices, and a wavelength conversion layer that absorbs light emitted from the semiconductor light emitting device and emits light having a different wavelength from that of the light emitted from the semiconductor light emitting device. For the wavelength conversion layer, a layer having, for example, a fluorescent body described below is used.

In addition, in the following, the case will be described where the above-mentioned semiconductor light emitting device 110 is combined with the wavelength conversion layer.

As illustrated in FIG. 10, in the semiconductor light emitting apparatus 210 according to this embodiment, reflecting films 23 are provided on the inner faces of a container 22 made of a ceramic or the like. The reflecting films 23 are provided separately on the inner side face and bottom face of the container 22. The reflecting films 23 are made of, for example, aluminum or the like. The semiconductor light emitting device 110 is placed on the reflecting film 23 provided on the bottom portion of the container 22 through a submount 24.

For fixing the semiconductor light emitting device 110, the submount 24, and the reflecting film 23 to each other, it is possible to use bonding with a bonding agent, solder, etc.

On the surface of the submount 24 on the semiconductor light emitting device side, electrodes, not shown, are provided, and these electrodes are connected to the pad electrode 4p on the p-side of the semiconductor light emitting device 110 and to the n-side electrode 7 through bonding wires 26.

A first fluorescent body layer 211 (wavelength conversion layer) containing a red fluorescent body is provided so as to cover the semiconductor light emitting device 110, and a second fluorescent body layer 212 (wavelength conversion layer) containing a blue, green, or yellow fluorescent body is formed on this first fluorescent body layer 211. A lid 27 made of a silicon resin is formed above these fluorescent body layers.

The first fluorescent body layer 211 contains a resin and a red fluorescent body dispersed in this resin.

For the red fluorescent body, $Y_2O_3$, $YVO_4$, $Y_2(P, V)O_4$, or the like, for example, can be used for a body material, and an activating substance of trivalent Eu ($Eu^{3+}$) is contained in the body material. More specifically, $Y_2O_3:Eu^{3+}$, $YVO_4:Eu^{3+}$, or the like can be used for the red fluorescent body. The molar concentration of $Eu^{3+}$ may be 1% to 10%. For the body material of the red fluorescent body, LaOS, $Y_2(P, V)O_4$, or the like may be used in addition to $Y_2O_3$ and $YVO_4$. Furthermore, $Mn^{4+}$ or the like may be used in addition to $Eu^{3+}$. More particularly, absorption at 380 nm increases by adding a small amount of Bi with trivalent Eu to the $YVO_4$ body material, so that the luminous efficacy can be further increased. For the resin, a silicon resin or the like, for example, can be used.

The second fluorescent body layer 212 contains a resin and at least one of a blue fluorescent body, green fluorescent body, and yellow fluorescent body dispersed in the resin. For example, the following may be used: a fluorescent body combining a blue fluorescent body and a green fluorescent body, a fluorescent body combining a blue fluorescent body and a yellow fluorescent body, or a fluorescent body combining a blue fluorescent body, a green fluorescent body, and a yellow fluorescent body.

For the blue fluorescent body, $(Sr, Ca)_{10}(PO_4)_6Cl_2:Eu^{2+}$, $BaMg_2Al_{16}O_{27}:Eu^{2+}$, or the like, for example, may be used.

For the green fluorescent body, $Y_2SiO_5:Ce^{3+}$ or $Tb^{3+}$ having the light emission center of trivalent Tb, for example, may be used. In this case, energy is transmitted from Ce ions to Tb ions to improve the excitation efficiency. For the green fluorescent body, $Sr_4Al_{14}O_{25}:Eu^{2+}$ or the like, for example, may be used.

For the yellow fluorescent body, $Y_3Al_5:Ce^{3+}$ or the like, for example, may be used.

For the resin, a silicon resin or the like, for example, may be used.

In particular, trivalent Tb exhibits a sharp light emission around 550 nm at which visibility is at a maximum, so that the luminous efficacy is markedly improved when combined with the sharp red light emission of trivalent Eu.

According to the semiconductor light emitting apparatus 210 according to this embodiment, ultraviolet light of 380 nm, for example, emitted from the semiconductor light emitting device 110 allows the efficient excitation of the above-mentioned fluorescent bodies contained in the fluorescent body layers. In addition, the light is reflected off the reflecting film 23, and allowed to be efficiently emitted from the lid 27.

For example, in the above-mentioned fluorescent body having the light emission center of trivalent Eu or the like included in the first fluorescent body layer 211, light is converted into the light having a narrow wavelength distribution around 620 nm to efficiently produce red visible light.

The blue, green, or yellow fluorescent body contained in the second fluorescent body layer 212 is efficiently excited, allowing efficient production of blue, green, or yellow visible light.

Mixing such colors allows white light and light of other various colors to be produced with high efficiency and good color rendition.

Next, a method for manufacturing the semiconductor light emitting apparatus 210 according to this embodiment will be described.

Because the methods described above may be used in the processes of fabricating the semiconductor light emitting device 110, the processes after completion of the semiconductor light emitting device 110 will be described below.

First, a metal film to be the reflecting film 23 is formed on the inner face of the container 22 by sputtering, for example. This metal film is patterned, and the reflecting film 23 is left on each of the inner side face and the bottom face of the container 22.

Subsequently, the semiconductor light emitting device 110 is fixed on the submount 24, and the electrodes of the submount 24 are connected to the p-side pad electrode 4p and to the n-side electrode 7 through bonding wires 26. The submount 24 is placed and fixed on the reflecting film 23 on the bottom face of the container 22.

The first fluorescent body layer 211 containing the red fluorescent body is formed so as to cover the semiconductor light emitting device 110 and the bonding wires 26, and the second fluorescent body layer 212 containing the blue, green, or yellow fluorescent body is formed on the first fluorescent body layer 211.

For the method of forming the individual fluorescent body layers, it is possible to adopt such a method that, for example, each of the fluorescent bodies is dispersed into a raw resin material mixed solution and the mixed solution is dropped and heated for curing the resin by thermal polymerization. In addition, the raw resin material mixed solution containing each of the fluorescent bodies is dropped, allowed to stand for a while, and then cured. This causes the fine particles of each of the fluorescent bodies to precipitate for uneven distribution of the fine particles of each of the fluorescent bodies in the lower part of the first and second fluorescent body layers 211 and 212, allowing appropriate control of the luminous efficacy of each of the fluorescent bodies. After that, the lid 27 is disposed on the fluorescent body layer 212, and then the semiconductor light emitting apparatus 210 according to this embodiment, i.e., a white LED, is fabricated.

According to embodiments, there are provided a semiconductor light emitting device, a semiconductor light emitting apparatus, and a method for manufacturing a semiconductor light emitting device that improve light extraction efficiency while increasing current injection efficiency.

Hereinabove, exemplary embodiments are described with reference to specific examples. However, the invention is not limited to these specific examples. For example, one skilled in the art may appropriately select configurations, sizes, material qualities, arrangements, etc., of components of semiconductor multiple-layer films, metal films, dielectric films, etc., of semiconductor light emitting devices or manufacturing methods from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor light emitting devices and semiconductor light emitting apparatuses obtainable by an appropriate design modification by one skilled in the art based on the semiconductor light emitting devices and the semiconductor light emitting apparatuses described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
a stacked structural body including a first semiconductor layer, a second semiconductor layer, and a light emitting layer provided between the first semiconductor layer and the second semiconductor layer;
a first electrode electrically connected to the first semiconductor layer;
a second electrode forming an ohmic contact with the second semiconductor layer, the second electrode being translucent to light emitted from the light emitting layer, the second electrode including an oxide of at least one element selected from the group consisting of In, Zn, Sn, Ni, Mg, Cu, Au, Pd, Rh, and Ga;
a third electrode being silver, the third electrode penetrating through the second electrode and electrically connected to the second electrode to contact with the second semiconductor layer; and
a fourth electrode, the third electrode being disposed between the fourth electrode and the second semiconductor layer, a shape of the fourth electrode as viewed along a stacking direction of the first semiconductor layer, the light emitting layer, and the second semiconductor layer being same as a shape of the third electrode as viewed along the stacking direction;
wherein
the third electrode includes a first portion and a second portion, the first portion being provided between the second semiconductor layer and the fourth electrode, the first portion contacting the second semiconductor layer and the fourth electrode, the second portion provided between the second electrode and the fourth electrode,
the first portion has a first face opposing the fourth electrode,
the second portion has a second face opposing the fourth electrode, and
a first distance between the first face and the second semiconductor layer is shorter than a second distance between the second face and the second semiconductor layer.

2. The device according to claim 1, wherein a transmittance of the second electrode to the emitted light is greater than a transmittance of the third electrode to the emitted light.

3. The device according to claim 2, wherein,
the first semiconductor layer is made of an n-type semiconductor;
the second semiconductor layer is made of a p-type semiconductor and opposes a part of the first semiconductor layer;
the stacked structural body has a first major surface on a side of the second semiconductor layer; and
the first electrode, the second electrode, the third electrode, and the fourth electrode are provided on a side of the first major surface of the stacked structural body.

4. The device according to claim 2, wherein:
the first semiconductor layer is made of a p-type semiconductor;
the second semiconductor layer is made of an n-type semiconductor;
the stacked structural body has a second major surface on a side of the first semiconductor layer and a third major surface on a side of the second semiconductor layer;
the first electrode is provided on a side of the second major surface of the stacked structural body; and
the second electrode, the third electrode, and the fourth electrode are provided on a side of the third major surface of the stacked structural body.

5. The device according to claim 4, wherein the third electrode covers a part of the second electrode.

6. The device according to claim 5, wherein the fourth electrode is a pad electrode.

7. The device according to claim 6, wherein the first semiconductor layer and the second semiconductor layer include $In_xAl_yGa_{1-x-y}N$ ($0 \le x \le 1$, $0 \le y \le 1$, $x+y \le 1$).

8. The device according to claim 1, wherein a conductivity of the third electrode is lower than a conductivity of the second electrode.

9. The device according to claim 1, wherein the reflectance of the third electrode to the emitted light is 80% or more.

10. The device according to claim 1, wherein the fourth electrode includes an Ni layer provided on the third electrode and an Au layer provided on the Ni layer.

11. The device according to claim 10, wherein the emitted light is emitted from a side on which the second electrode of the stacked structural body is provided.

12. The device according to claim 1, wherein the fourth electrode includes a stacked body including a Ti layer provided on the third electrode, a Pt layer provided on the Ti layer, and an Au layer provided on the Pt layer.

13. A semiconductor light emitting apparatus, comprising:
a semiconductor light emitting device, including:
a stacked structural body including a first semiconductor layer, a second semiconductor layer, and a light emitting layer provided between the first semiconductor layer and the second semiconductor layer;
a first electrode electrically connected to the first semiconductor layer;

a second electrode forming an ohmic contact with the second semiconductor layer, the second electrode being translucent to light emitted from the light emitting layer, the second electrode including an oxide of at least one element selected from the group consisting of In, Zn, Sn, Ni, Mg, Cu, Au, Pd, Rh, and Ga;

a third electrode being silver, the third electrode penetrating through the second electrode and electrically connected to the second electrode to contact with the second semiconductor layer; and a fourth electrode, the third electrode being disposed between the fourth electrode and the second semiconductor layer, a shape of the fourth electrode as viewed along a stacking direction of the first semiconductor layer, the light emitting layer, and the second semiconductor layer being same as a shape of the third electrode as viewed along the stacking direction, a reflectance of the third electrode to the emitted light is greater than a reflectance of the fourth electrode to the emitted light; and a wavelength conversion layer configured to absorb light emitted from the semiconductor light emitting device and emit light having a different wavelength from a wavelength of the light emitted from the semiconductor light emitting device;

wherein the third electrode includes a first portion and a second portion, the first portion being provided between the second semiconductor layer and the fourth electrode, the first portion contacting the second semiconductor layer and the fourth electrode, the second portion provided between the second electrode and the fourth electrode, the first portion has a first face opposing the fourth electrode, the second portion has a second face opposing the fourth electrode, and a first distance between the first face and the second semiconductor layer is shorter than a second distance between the second face and the second semiconductor layer.

* * * * *